(12) United States Patent
Remsburg

(10) Patent No.: US 10,307,861 B2
(45) Date of Patent: Jun. 4, 2019

(54) BONDED ALUMINUM-DISSIMILAR METAL STRUCTURE AND METHOD OF MAKING SAME

(71) Applicant: COOLER MASTER CORP., New Taipei (TW)

(72) Inventor: Ralph Remsburg, Midland, TX (US)

(73) Assignee: COOLER MASTER CORP., New Taipei (TW)

( * ) Notice: Subject to any disclaimer, the term of this patent is extended or adjusted under 35 U.S.C. 154(b) by 407 days.

(21) Appl. No.: 14/984,428

(22) Filed: Dec. 30, 2015

(65) Prior Publication Data

US 2016/0187080 A1    Jun. 30, 2016

Related U.S. Application Data

(60) Provisional application No. 62/097,605, filed on Dec. 30, 2014, provisional application No. 62/099,125, (Continued)

(51) Int. Cl.
| | |
|---|---|
| *B21D 39/00* | (2006.01) |
| *B23K 20/233* | (2006.01) |
| *B32B 15/01* | (2006.01) |
| *B23K 20/02* | (2006.01) |
| *B23K 20/00* | (2006.01) |
| *B23K 20/24* | (2006.01) |
| *B32B 3/26* | (2006.01) |
| *C22C 9/00* | (2006.01) |
| *B23K 35/28* | (2006.01) |

(Continued)

(52) U.S. Cl.
CPC ........ *B23K 20/2333* (2013.01); *B23K 20/002* (2013.01); *B23K 20/021* (2013.01); *B23K 20/023* (2013.01); *B23K 20/24* (2013.01); *B23K 26/355* (2018.08); *B23K 26/361* (2015.10); *B23K 26/389* (2015.10); *B23K 35/0255* (2013.01); *B23K 35/286* (2013.01); *B23K 35/302* (2013.01); *B32B 3/266* (2013.01); *B32B 15/01* (2013.01); *B32B 15/017* (2013.01); *C22C 9/00* (2013.01); *B23K 2103/10* (2018.08); *B23K 2103/12* (2018.08); *B23K 2103/18* (2018.08)

(58) Field of Classification Search
CPC ................................................ B21D 39/032
See application file for complete search history.

(56) References Cited

U.S. PATENT DOCUMENTS

| | | |
|---|---|---|
| 4,015,099 A | 3/1977 | Seniuk |
| 4,030,967 A | 6/1977 | Ingrey |
| | (Continued) | |

OTHER PUBLICATIONS

Shirzadi, A.A., "Diffusion Bonding Aluminum Alloys and Composites: New Approaches and Modelling," Ph.D. Thesis, King's College, University of Cambridge (Dec. 1997).

(Continued)

*Primary Examiner* — Adam Krupicka
(74) *Attorney, Agent, or Firm* — McDermott Will & Emery LLP

(57) ABSTRACT

A bonded dissimilar material structure includes a first component made of a first dissimilar material; a second component made of a second dissimilar material stacked under the first component; and a plurality of blind holes formed on an upper surface of the second component; and the first component has a plurality of protrusions formed in the plurality of blind holes on the second component, respectively.

14 Claims, 12 Drawing Sheets

Related U.S. Application Data filed on Dec. 31, 2014, provisional application No. 62/097,030, filed on Dec. 27, 2014.

(51) Int. Cl.
  *B23K 35/30* (2006.01)
  *B23K 35/02* (2006.01)
  *B23K 26/361* (2014.01)
  *B23K 26/382* (2014.01)
  *B23K 26/352* (2014.01)
  B23K 103/10 (2006.01)
  B23K 103/12 (2006.01)
  B23K 103/18 (2006.01)

(56) References Cited

U.S. PATENT DOCUMENTS

| | | | |
|---|---|---|---|
| 5,836,506 A * | 11/1998 | Hunt | B23K 20/023 |
| | | | 204/298.12 |
| 6,897,123 B2 | 5/2005 | Winther | |
| 2004/0035698 A1* | 2/2004 | Ivanov | B23K 9/0026 |
| | | | 204/298.12 |
| 2008/0230208 A1* | 9/2008 | Rasmussen | F28F 3/12 |
| | | | 165/80.4 |
| 2014/0017512 A1 | 1/2014 | Iimori | |

OTHER PUBLICATIONS

Truog, A.G., Bond Improvements of Al/Cu Joints Created by Very High Power Ultrasonic Additive Manufacturing, Master's Thesis, Ohio State University (2012).

\* cited by examiner

BONDED ALUMINUM-DISSIMILAR METAL STRUCTURE AND METHOD OF MAKING SAME

CROSS REFERENCE TO RELATED APPLICATIONS

This application claims the benefit of provisional patent application Ser. Nos. 62/097,030 filed on Dec. 27, 2014, 62/097,605 filed Dec. 30, 2014, and 62/099,125 filed on Dec. 31, 2014 by the present inventor, the entire contents of which are hereby incorporated by references.

FIELD OF THE INVENTION

The present invention relates to bonded dissimilar material structure, in particular to a bonded aluminum or aluminum alloy to copper or copper alloy structure.

BACKGROUND OF THE INVENTION

There are many applications for highly integrally bonded dissimilar metals. In particular, bonding aluminum to dissimilar metals, particularly copper, is useful in applications requiring high thermal or electrical conductivity, and has been the subject of searches and studies in the industry. However, although copper is an excellent heat and electrical conductor, copper has a high CTE (coefficient of thermal expansion) that does not match the CTE for semiconductor materials.

Aluminum is a metal that is very difficult to bond to other materials or to itself. Aluminum is highly reactive to oxygen, nitrogen and argon. The aluminum base metal forms a tenacious non-permeable oxide layer upon contact with the atmosphere. This oxide layer protects the base metal from further oxidation. The oxide layer can grow to 5.0 nm in a natural environment, and in a hot environment (300° C.) the oxide layer can grow to 30 nm thick. If the oxide layer is removed, it will immediately reform. The oxide layer is a good dielectric layer and has poor thermal conductivity, and thus prevents another material from bonding with the aluminum base metal. In any application that requires bonding aluminum and copper, the aluminum surface must be free of all oxide particles.

In general there are three methods used to remove aluminum oxide: mechanical, chemical, and plasma. There are also combinations of these three methods. The mechanical method usually involves drawing stainless steel wire brush rapidly across the bonding surface or machining the surface. Chemical methods to remove aluminum include using acid (nitric acid, $HNO_3$) solutions or alkaline (sodium hydroxide, NaOH) solutions. U.S. Provisional Patent Application No. 62/097,030 teaches the use of an acid consisting of 80% phosphoric acid ($H_3PO_4$)+5% acetic acid ($CH_3COOH$)+5% nitric acid ($HNO_3$)+10% water ($H_2O$). Plasma cleaning processes have also been used to successfully remove aluminum oxide. If the aluminum part is attached to a negative pole, a stream of positive ions will bombard the surface, and break up the aluminum oxide layer. The dislodged particles can be removed by a plasma arc. U.S. Pat. No. 4,030,967 to Ingrey, Nentwich, and Poulsen (1977) describes a plasma etching process that removes aluminum oxide using gaseous trihalide in a radical-flow type reactor. However, after the aluminum oxide layer is removed, the aluminum component must be processed quickly because a new oxide layer immediately begins to form as soon as the cleaning process ends.

There are many solid state methods known to bond aluminum to aluminum or to a dissimilar metal. In roll bonding, the surfaces of the materials are cleaned and then immediately passed through a rolling mill. The large plastic deformation causes the oxide layer to fracture and materials are able to bond with the aluminum base metal by heat and pressure. In the diffusion bonding method, the surfaces of the materials are cleaned and then pressed together using a mechanical force or by an isostatic pressure. The variables deciding whether there is a successful bond are the degree of the elimination of the oxide layer, temperature, pressure, and time. In the ultrasonic bonding method, ultrasonic energy and pressure induce an oscillating shear force that fractures oxide layer and then produces a metallurgical bond. In the explosive welding method, the materials are placed at an angle and a detonator causes one plate to impact the other plate. The force of the impact removes a thin layer from the material surfaces and the high pressure causes the materials to bond. Bond quality is dependent on collision angle, impact velocity, material properties, and geometry. Friction welding method uses a rotary or linear motion of two materials against each other. An advantage of friction welding, like explosion welding, is that the welding process itself removes the oxide layer.

There are many types of material that can be bonded. However, achieving a successful bond of aluminum and copper is difficult. The materials react and form intermetallics above 120° C. Intermetallic $Al_2Cu$ forms first, followed by $Al_4Cu_9$, and then AlCu. In the present application, the diffusion bonding of aluminum alloys and copper alloys is described.

There are two basic types of diffusion bonding. One is to use a mechanical force to apply pressure to bond the components, and the other is to use a pressure chamber to apply isostatic pressure. The method of applying a high pressure gas force is known as Hot Isostatic Pressing (HIP). Both methods can be used to stack components so that multiple components can be bonded in a single batch process.

Within the domain of diffusion bonding there are subsets of the two basic processes. Shirzadi (1997) presents an analysis of six Transient Liquid Phase methods for diffusion bonding AlSiC to AlSiC (Aluminum Silicon Carbide). However, Transient Liquid Phase methods are costly and not well suited for high volume production.

A few patents teach methods of interlocking aluminum and copper to form a stronger bonded material that provides better thermal and electrical conductivity. U.S. Pat. No. 4,015,099 to Seniuk and Gagnon (1977) discloses a method to silver coat a threaded copper button, and after threading into an aluminum piece, preheating the assembly to between 190° C. and 245° C., and then arc welding using aluminum filler under an inert gas shield. U.S. patent application 2014/0017512 to Iimori and Hopper (2014) teaches the use of a copper-plated aluminum button which passes through a cloth member, and plastically deforms to interlock with a concave mating flange. U.S. provisional patent application 62/097,605 to Remsburg (2014) teaches a single interlocking layer between closely matched materials.

However, the above disclosures all fail to provide an effective interlock mechanism to increase the strength, electrical conductivity, thermal conductivity, and CTE matching of the stacked dissimilar metals.

SUMMARY OF THE INVENTION

In order to solve the problems described above, example embodiments of the present invention provide a bonded dissimilar material structure, which has wide use in applications requiring efficient heat transfer and high CTE (coefficient of thermal expansion) matching. Example embodiments of the present invention also provide a method of manufacturing the bonded dissimilar material structure. Example embodiments of the present invention also provide a method for removing an aluminum oxide layer.

In an example embodiment, a bonded dissimilar material structure includes a first component made of a first dissimilar material; a second component made of a second dissimilar material stacked under the first component; and a plurality of blind holes formed on an upper surface of the second component; and the first component has a plurality of protrusions formed in the plurality of blind holes on the second component, respectively.

In another example embodiment, the first component is made of aluminum or aluminum alloys and the second component is made of copper or copper alloys.

In an example embodiment, the first component and the second component are bonded using a diffusion bonding process.

Example embodiments of the present invention also provide a heat transfer device, comprising: a bonded dissimilar material structure according to an example embodiment; and a plurality of aluminum convection pins formed on an upper surface of the bonded dissimilar material structure.

Example embodiments of the present invention further provides a method for producing a bonded dissimilar material structure, comprising: providing a first component made of a first material; providing a second component made of a second material, wherein the second material has a yield strength higher than the yield strength of the first material; forming a plurality of blind holes on an upper surface of the second; cleaning surfaces the first component and the second component; stacking the first component on the second component; and bonding the first component and the second component using a diffusion bonding process.

Accordingly, example embodiments of the present invention provide the following advantages: during the bonding process, surfaces of the all component remain oxide-free; a plurality of mechanical interlock structures are used to attach the components together so that the bonded dissimilar material structure can bear large differences in thermal expansion between the two components and the bonded dissimilar material structure has high electrical conductivity and high thermal conductivity.

BRIEF DESCRIPTION OF THE DRAWINGS

The above features and advantages of the present invention will become more apparent by describing in detail exemplary embodiments thereof with reference to the attached drawings in which.

DETAILED DESCRIPTION OF THE EXAMPLE EMBODIMENTS OF THE PRESENT INVENTION

Figure 1A:
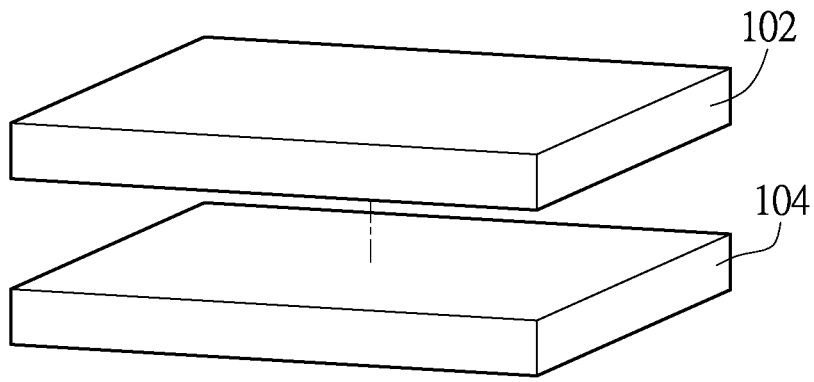
FIG. 1A is an exploded view of a conventional bonded dissimilar material structure.
Figure 1B:
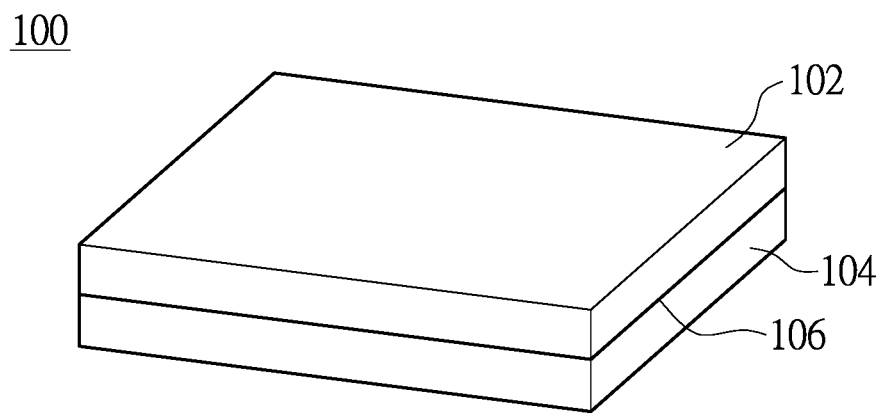
FIG. 1B depicts a conventional bonded dissimilar material structure as illustrated in FIG. 1A.
Figure 1C:
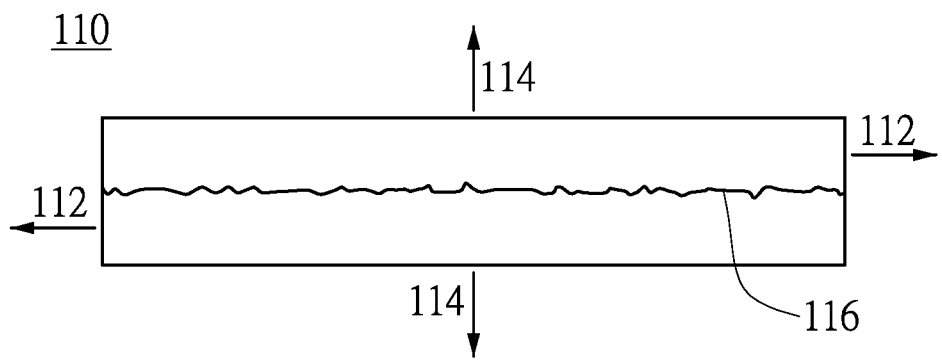
FIG. 1C depicts a conventional bonded dissimilar material structure subjected to shear and tensile forces.

FIGS. 1A-1C depict a conventional bonded dissimilar material structure including an aluminum plate 102 and a copper plate 104. Plates 102 and 104 may be materials other than aluminum and copper. The faying surfaces of the plates must be clean and free from oxides. The surface finish of plates 102 and 104 is particularly important. The faying surfaces must have a surface finish equal to or better than 0.4 Ra µm (16 Ra µin) before bonding process starts. A surface finish in this range usually needs expensive polishing and lapping processes. Surface finish is an important factor in the quality of the final product.

Referring to FIG. 1B, a prior art aluminum/copper weldment 100 is shown before use. Aluminum/copper weldment 100 is comprised of aluminum plate 102 and copper plate 104. There are many methods for bonding plates 102 and 104. In this figure, the aluminum/copper weldment 100 is made using a diffusion bond method. An interface between aluminum plate 102 and copper plate 104 is shown as 106.

Referring to FIG. 1C, the aluminum/copper weldment 110 is shown after a period of use. The aluminum/copper interface 116 of aluminum/copper weldment 110 is stressed by a shear force 112 and a tensile force 114. Over time, stress forces 112 and 114, along with a coefficient of thermal expansion difference between aluminum and copper often lead to delamination and cracking at interface 116.

Figure 2:
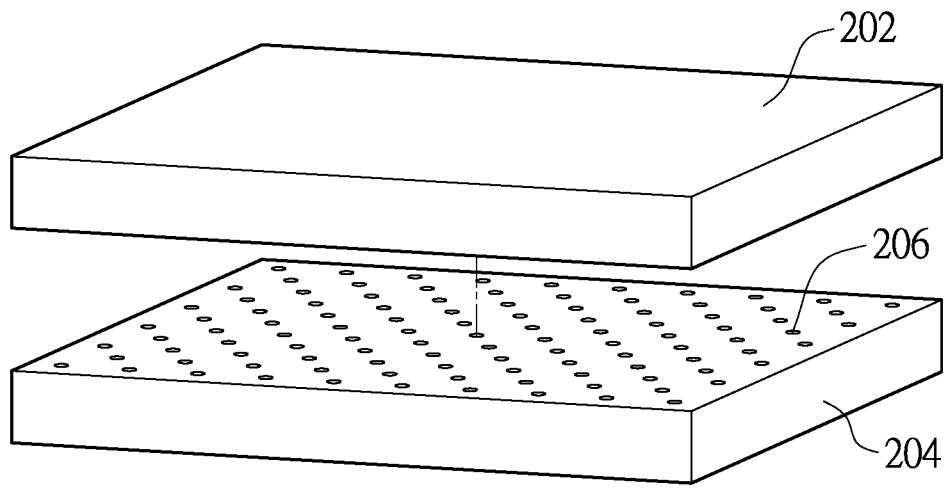
FIG. 2 is an exploded view of a bonded aluminum and copper structure according to an example embodiment.

FIG. 2 is an exploded view of a bonded aluminum and copper structure including an aluminum plate 202 and a copper plate 204 according to an example embodiment of the present invention. Aluminum plate 202 can be of a variety of sizes and shapes, but a plate is shown for illustration purposes. Copper plate 204 can also be of a variety of shapes and sizes. Another type of metal other than copper may be used. In this example embodiment copper is used for its high thermal conductivity and usefulness. Whatever materials are chosen, plate 202 must have a lower modulus and yield strength than plate 204 at the bonding temperature. The surface finish of aluminum plate 202 and copper plate 204 has a wide range of acceptability. In general, a surface finish equal to or better than 6.3 Ra μm (250 Ra μin) is acceptable. A surface finish in this range is easily accomplished by sand casting, EDM, laser cutting, or a variety of rough cut processes.

The faying surface of copper plate 204 contains a plurality of holes 206. The hole pattern may be a staggered pattern or an in-line pattern. Depending on the application, the pattern may be formed to suit a specific structural, thermal, or other purpose. Round holes are shown in this example embodiment, but squares, diamonds, and other shapes may be used. Features of these holes such as size, shape, depth, angle, and pattern, may be altered to suit a specific application.

Figure 3:
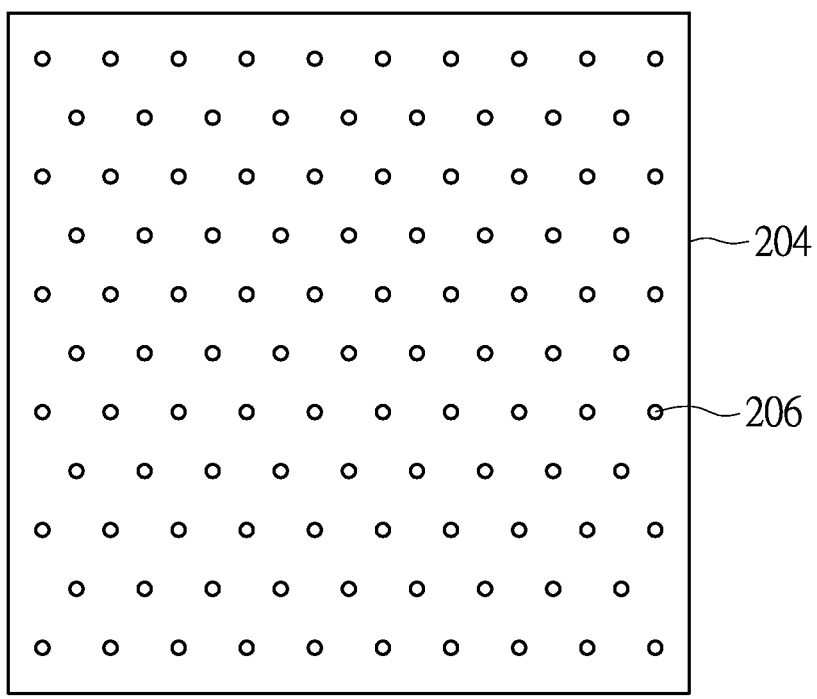
FIG. 3 shows a plane view of the faying surface of copper plate 204 according to example embodiment illustrated in FIG. 2.

FIG. 3 shows a plane view of the faying surface of copper plate 204, displaying a staggered pattern of round blind holes 206. The holes may be manufactured easily and economically using a variety of processes including forging, laser drilling, mechanical drilling, EDM, and chemical etching, etc.

Figure 4A:
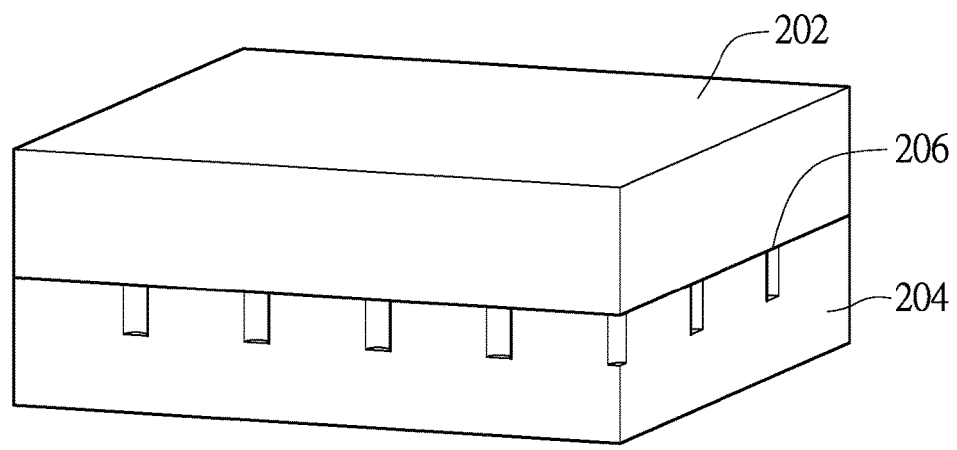
FIG. 4A shows a cross-sectional view of a portion of the stacked aluminum/copper plate structure before bonding according to an example embodiment of the present invention.

FIG. 4A shows a cross-sectional view of a portion of the stacked aluminum/copper plate structure before bonding according to an example embodiment of the present invention. The plate pair, aluminum plate 202 and copper plate 204 are placed inside a mechanical force or isostatic pressure diffusion bonding apparatus. The plate pairs may be processed individually or in stacks.

In general, there are three methods used to remove aluminum oxide: mechanical, chemical, and plasma. There are also combinations of these three methods. Chemical methods to remove aluminum oxide use acid (nitric acid, $HNO_3$) or alkaline (sodium hydroxide, NaOH) solutions. An example of a known acid cleaning process is to immerse an aluminum part in a 50% nitric acid aqueous solution at the room temperature for 15 minutes. The part is then rinsed in cold water, then rinsed in hot water, and then dried. Acid and alkaline cleaning processes can be combined. A known combination cleaning process is to immerse an aluminum part in a 5% NaOH solution and heat the aluminum part to 70° C. for one minute. Then, rinse the aluminum part in cold water, and then immerse the aluminum part in a 50% nitric acid aqueous solution at the room temperature for about 30 seconds, followed by a cold water rinse and then a hot water rinse, and then dry the aluminum part. After the aluminum oxide layer is removed, the aluminum component must be processed quickly because a new oxide layer begins to form as soon as the cleaning process ends.

An etching process taught in related U.S. provisional patent application Ser. No. 62/097,030, filed 2014 Dec. 27 by the inventor of the present invention works well. The metal parts are sealed in a chamber or in a can and immersed in an etching solution for about 15 seconds. The etchant consists of 75%~85% phosphoric acid ($H_3PO_4$), 0%~10% acetic acid ($CH_3COOH$), 0%~10% nitric acid ($HNO_3$), and 5%~15% water ($H_2O$). The etching solution should be at approximately room temperature. After the metal parts are immersed for 15 seconds, the etchant should be drained using a vacuum. The vacuum should be maintained until all of the etchant has evaporated and the pressure inside the chamber is about $1\times10^{-2}$ Pa or lower. By following the time temperature and etchant recommendations about 0.05 μm of material will be removed from the aluminum surfaces of the aluminum plate 202. The vacuum action will cause the etchant to boil, and this agitation will displace the aluminum oxide particles. The vacuum, while removing the boiling etchant, will also prevent aluminum plate 202 from further etching. This process will leave the faying surfaces of the plates 202 and 204 smooth with no oxides.

At this point, if the plates are etched in a diffusion bonding chamber, they should now be placed in the chamber under a vacuum. If the plates are processed in vacuum cans, load the cans into an isostatic pressure diffusion bonding apparatus. In either case, the diffusion bonding apparatus needs to be first heated to about 550° C.

Figure 4B:
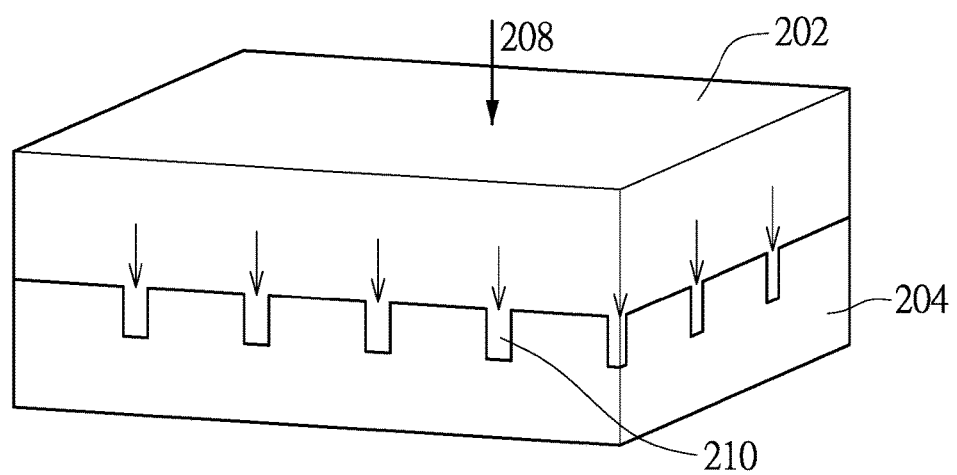
FIG. 4B shows a cross-sectional view of a stacked aluminum/copper plate after bonding.

Referring now to FIG. 4B, after the temperature of the parts has stabilized, a mechanical force or an isostatic pressure 208 of a pressure of about 110 MPa (15 kpsi) is applied to the stacked plates. An aluminum plate of A6063-T6 will have a yield strength of only about 3 MPa at 550° C., which is at 90% of solidus temperature. Copper is much stronger at this temperature, which is only at 51% of its melting temperature. Pressure 208 is distributed within plates 202 and 204. Because the parts are in a vacuum environment, aluminum plate 202 will be extruded into the holes 206 of the copper plate 204. The extrusion process will stop when all blind holes 206 are filled with extruded structural aluminum 210. A result of the bonding is weldment 200.

This combination of high isostatic pressure and high temperature causes the faying surfaces of the aluminum plate 202 and the copper plate 204 to be bonded after a period of about 2 hours. The exact value of the temperature, time, and pressure variables are determined by experiments and modeling of the plate materials. After bonding process ends, the heater can be deactivated and the chamber can be vented to the atmosphere. When the plate weldments cool they may be removed from the chamber.

Figure 5:
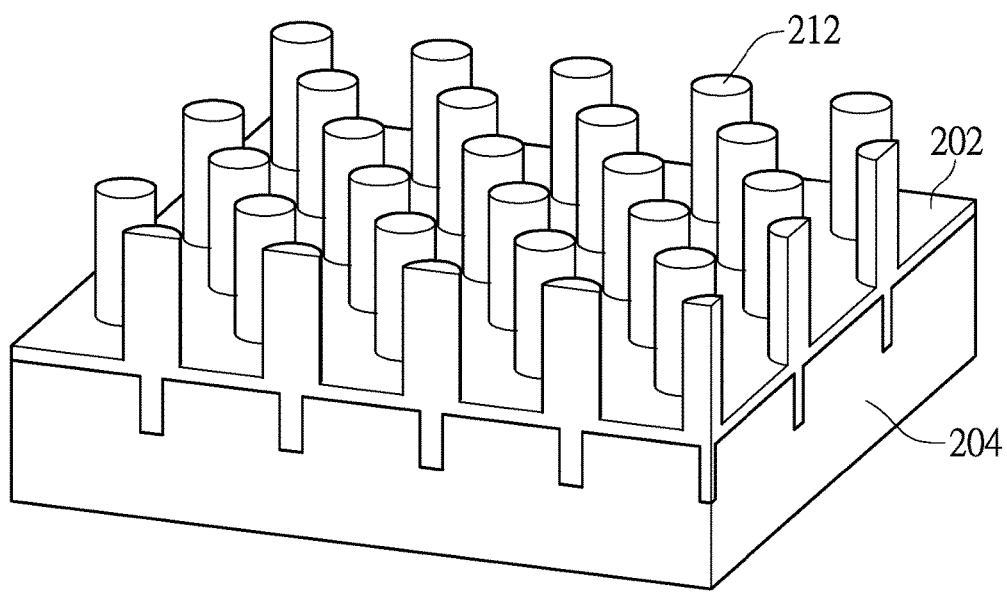
FIG. 5 shows a cross-sectional view of a finished heat sink according to an example embodiment.

FIG. 5 shows a cross-sectional view of a finished heat sink 310. After cooling, the weldment 200 may be processed to form a plurality of aluminum convection pins 212 on the exposed surface of aluminum plate 202.

Figure 6A:
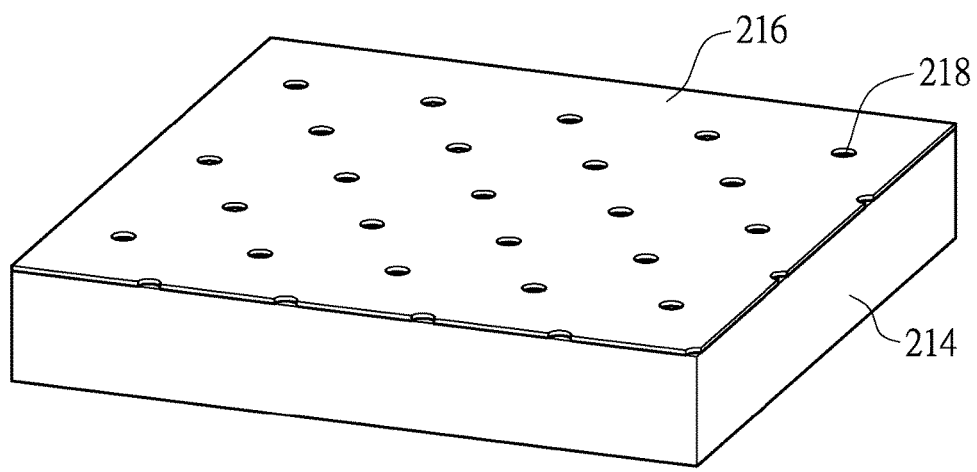
FIGS. 6A-6D illustrate a method for manufacturing a bonded dissimilar material structure according to another example embodiment of the present invention.

FIGS. 6A-6D illustrate a method for manufacturing a bonded dissimilar material structure according to another example embodiment of the present invention. Referring to FIG. 6A, a chemical resistant, photoresist 216, is applied on one planar surface of the copper plate 214. The process of removing portions of a copper substrate using a photoresist mask and a copper etchant is well known to those skilled in the art. The basic process is as follows: 1) clean the copper plate surface, 2) laminate the photoresist to the copper surface, 3) design the photoresist using ultraviolet light source and artwork, 4) develop the photoresist, 5) bake the photoresist, 6) etch the exposed copper, 7) rinse the copper plate and the photoresist, 8) remove the photoresist, 9) rinse the copper plate, and 10) dry the copper plate. Referring to FIG. 6A, this copper plate is ready to be etched, as in step 6. When etchants are applied to the photoresist 216, etchants will enter the copper plate through the holes 218 and remove material of the copper plate 214 right below the holes in all directions.

Figure 6B:
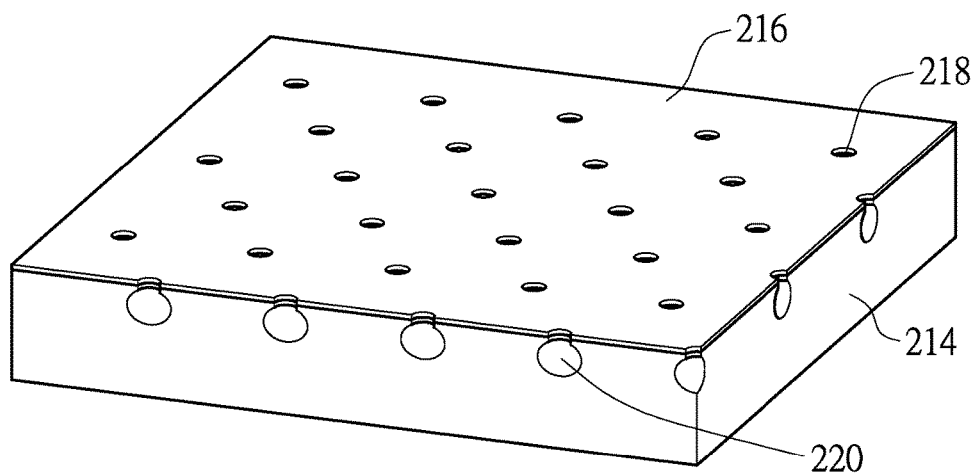

Referring to FIG. 6B, the copper plate 214 is shown after completing etching step 6, and rinsing step 7. Photoresist mask 216 has protected the surface of copper plate 214 except for the portions right under holes 218. A plurality of etched cavities 220, which may be of a round shape, is formed under photoresist mask holes 218. The parameters of the etch process can be changed to change the shape of the etched cavities.

Figure 6C:
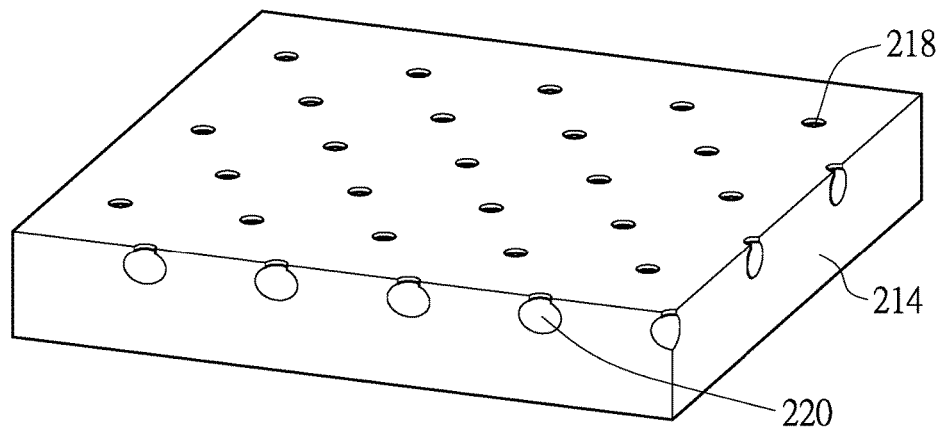

Referring to FIG. 6C, copper plate 214 is shown after the photoresist mask is removed. The unprotected copper material has been etched by the acid solution through holes 218 and etched cavities 220 in copper plate 214 are formed. The aluminum plate 202 and copper plate 214 are then processed in a diffusion bonding apparatus.

Figure 6D:
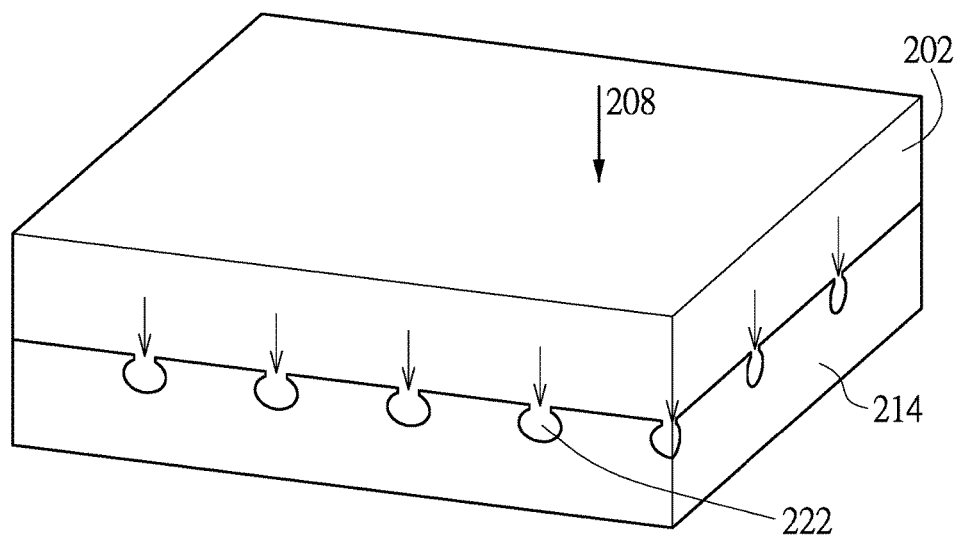

Referring now to FIG. 6D, after the temperature of the metal plates has stabilized, a mechanical force or an isostatic pressure of about 110 MPa (15 kpsi) is applied to the plates. An aluminum plate of A6063-T6 will have a yield strength of only about 3 MPa at 550° C., which is at 90% of solidus temperature. Copper is much stronger at this temperature, which is only at 51% of its melting temperature. Pressure 208 is distributed within plates 202 and 214. Because the parts are in a vacuum environment, aluminum plate 202 will be extruded into the etched cavities of copper plate 214. The extrusion process will stop when all etched cavities are filled with extruded aluminum 222.

The combination of high isostatic pressure and high temperature causes the faying surfaces of the plate 202 and 214 to be bonded after a period of about 2 hours. The exact values of the temperature, time, and pressure variables are determined by experiments and modeling of the plate materials. After the bonding process ends, the heater can be deactivated and the chamber can be vented to the atmosphere. When the plate weldments cool they may be removed from the chamber.

Figure 7:
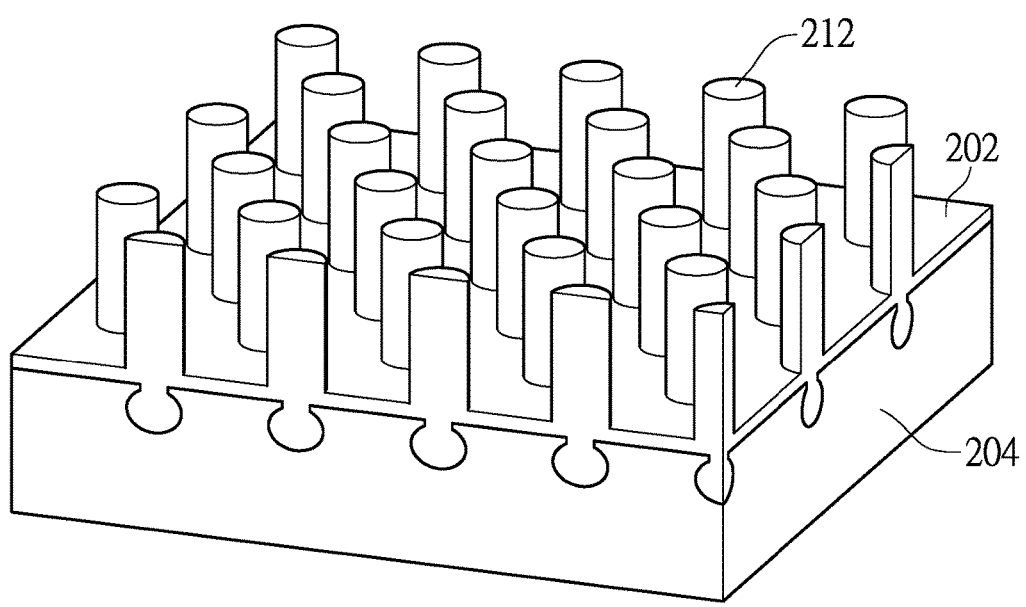
FIG. 7 shows a cross-sectional view a finished heat sink according to another example embodiment.

FIG. 7 shows a cross-sectional view a finished heat sink 320 according to an example embodiment of the present invention. After cooling, the weldment, i.e. the bonded aluminum/copper plate structure, may be processed to form a plurality of aluminum convection pins 212 on the exposed surface of aluminum plate 202. The plurality of aluminum convection pins 212 may be formed above the etched cavities, respectively.

Figure 8A:
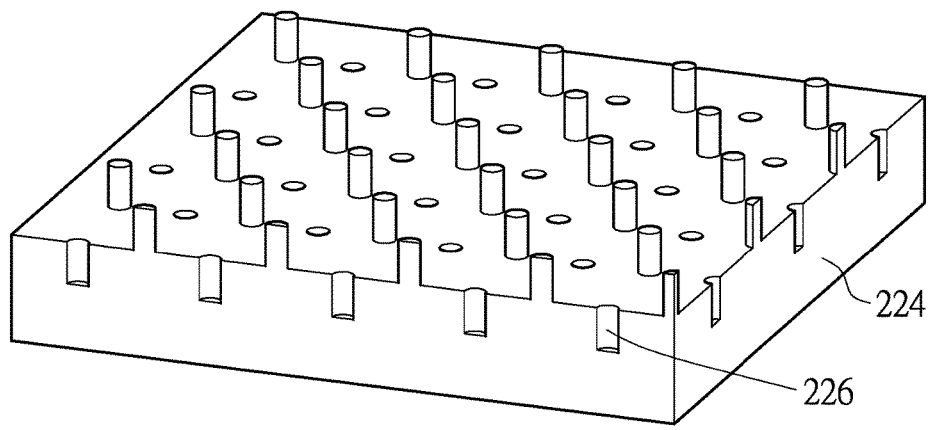
FIG. 8A shows a cross-sectional view of a copper plate 224 with column-shaped blind holes and conduction pins 224 according to an example embodiment of the present invention.

FIG. 8A shows a cross-sectional view of a copper plate 224 with column-shaped blind holes and conduction pins 224 according to an example embodiment of the present invention. A plurality of column-shaped blind holes 226 are formed on a planar surface of the copper plate and a plurality of conducting pins 228 are placed on the planar surface of copper plate 224. There are a variety of methods that may be used to process the column-shaped blind holes 226 and conducting pins 228 of copper plate 224. The plurality of column-shaped blind holes 226 and the plurality of conducting pins 228 are arranged alternately on the copper plate 224. The depth, height, spacing, angle, shape, and other features of the column-shaped blind holes 226 and the conducting pins 228 can be designed to suit particular applications.

Figure 8B:
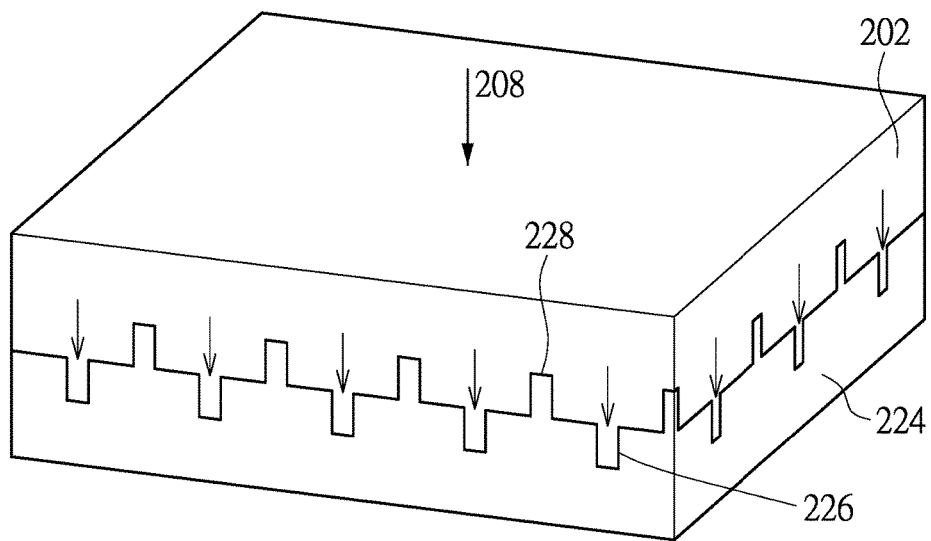
FIG. 8B shows a cross-sectional view of the bonded aluminum/copper structure according to the example embodiment illustrated in FIG. 8A.

FIG. 8B shows a cross-sectional view of the bonded aluminum/copper structure. The aluminum plate 202 and copper plate 224 are processed in a diffusion bonding apparatus. After the temperature of the metal plates has stabilized, a mechanical force or an isostatic pressure of about 110 MPa (15 kpsi) is applied to the plates. An aluminum plate of A6063-T6 will have a yield strength of only about 3 MPa at 550° C., which is at 90% of solidus temperature. Copper is much stronger at this temperature, which is only at 51% of its melting temperature. Pressure 208 is distributed within plates 202 and 224. Because the parts are in a vacuum environment, aluminum plate 202 will be extruded into the column-shaped blind holes 226 of copper plate 224. At the same time, aluminum plate 202 will yield to the conducting pins 228 of the copper plate and let the conducting pins 228 be inserted to the aluminum plate 202.

The combination of high isostatic pressure and high temperature causes the faying surfaces of the plate 202 and 224 to be bonded after a period of about 2 hours. The exact values of the temperature, time, and pressure variables are determined by experiments and modeling of the plate materials. After bonding process ends, the heater can be deactivated and the chamber can be vented to the atmosphere. When the plate weldments cool they may be removed from the chamber.

Figure 9:
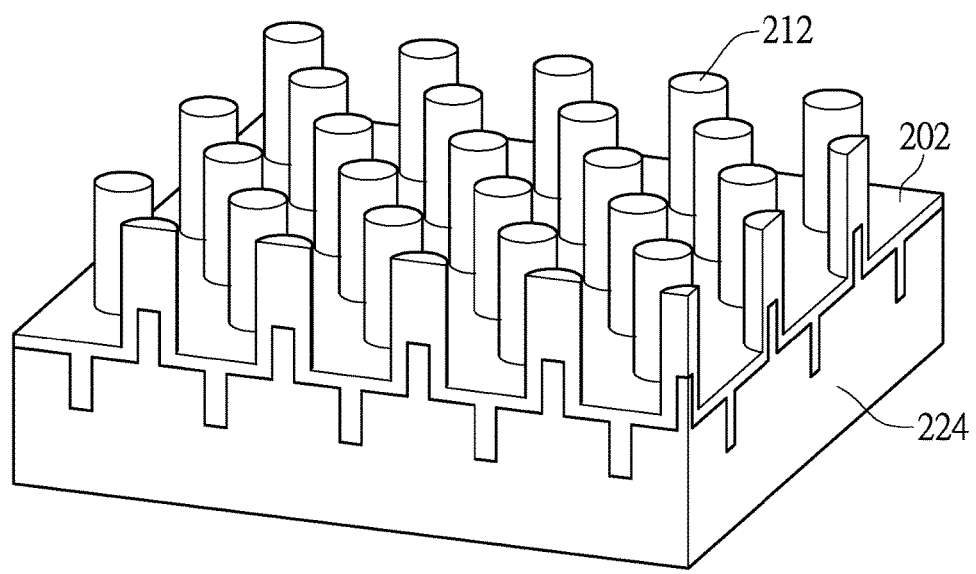
FIG. 9 shows a cross-sectional view of a finished heat sink according to another example embodiment.

FIG. 9 shows a cross-sectional view of a finished heat sink 330 according to an example embodiment of the present invention. After cooling, the weldment, i.e. the bonded aluminum/copper plate structure, may be processed to form a plurality of aluminum convection pins 212 on the exposed surface of aluminum plate 202, which is bonded to copper plate 224. Because of the aluminum protrusions formed in the column-shaped blind holes 226 of the copper plate 224 and the copper conducting pins 228 inserted into the aluminum plate 202, the finished heat sink 330 exhibits greater resistance to shear, tensile, and thermal expansion forces, meanwhile having a low thermal resistance.

Figure 10A:
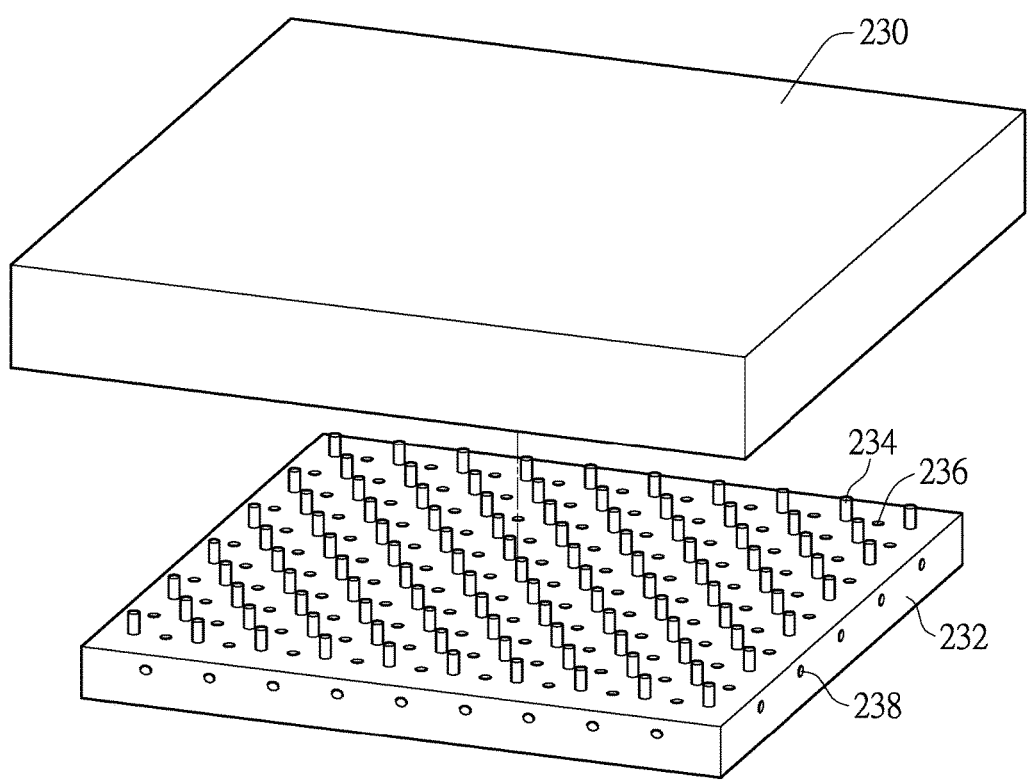
FIG. 10A shows an exploded view of a bonded aluminum/copper material structure according to another example embodiment of the present invention.

FIG. 10A shows an exploded view of a bonded aluminum/copper material structure according to an example embodiment of the present invention. A plurality of conducting pins 234 and a plurality of blind holes 236 are formed on the upper surface of the copper plate 232. A plurality of transverse holes 238 are formed on the side surfaces of the copper plate 232. There are a variety of methods that may be used to form the blind holes 226 and conducting pins 228 on the upper surface of the copper plate 232.

The plurality of blind holes 236 and the plurality of conducting pins 234 are arranged alternately on the upper surface of the copper plate 232. The depth, height, spacing, angle, shape, and other features of the blind holes 236 and the conducting pins 234 can be designed to suit particular applications.

Figure 10B:
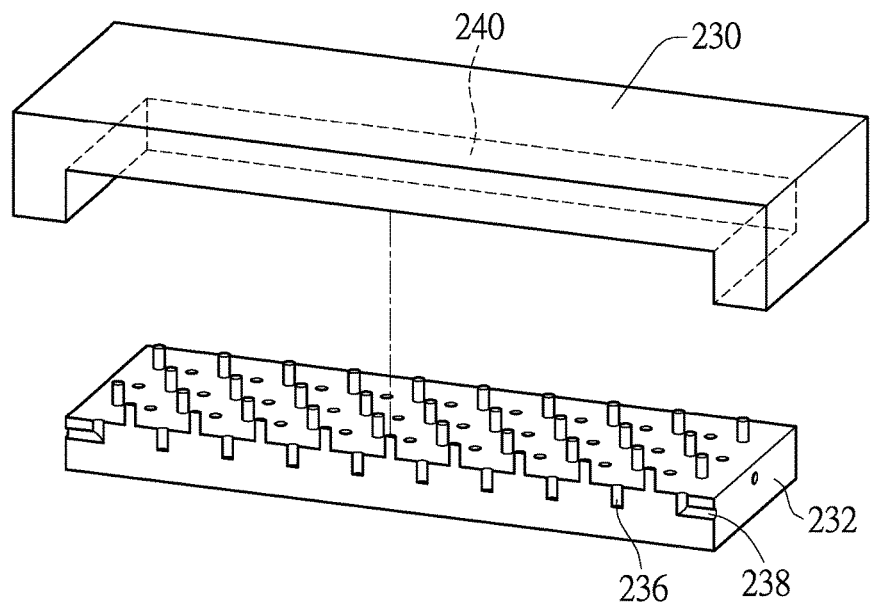
FIG. 10B is a cross-sectional view of the bonded aluminum/copper material structure illustrated in FIG. 10A.

Referring now to FIG. 10B, which is a cross-sectional view of the bonded aluminum/copper material structure illustrated in FIG. 10A, the aluminum plate 230 has an accommodating space 240 for accommodating the copper plate 232. In other words, the aluminum plate 230 not only covers the upper surface of the copper plate 232, but also the side surfaces of the copper plate 232. The plurality of blind holes 236 and plurality of transverse blind holes 238 are shown in this figure. Some of the blind holes 236 and some of the transverse blind holes 238 may intersect.

Figure 10C:
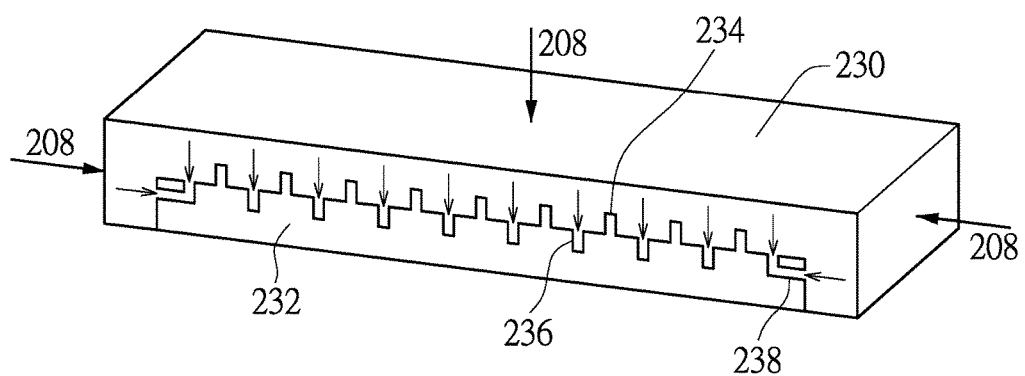
FIG. 10C is a cross-sectional view of the bonded aluminum/copper material structure illustrated in FIG. 10A.

Referring now to FIG. 10C, the aluminum plate 230 and the copper plate 232 are processed in an isostatic diffusion bonding apparatus. After the temperature of the aluminum plate 230 and the copper plate 232 has stabilized, an isostatic pressure 208 of about 110 MPa (15 kpsi) is applied to the plates from all directions. An aluminum plate of A6063-T6 will have a yield strength of only about 3 MPa at 550° C., which is at 90% of solidus temperature. Copper is much stronger at this temperature, which is only at 51% of its melting temperature. Pressure 208 is distributed within plates 230 and 232. Because the parts are in a vacuum environment, the aluminum plate 230 will be extruded into the blind holes 236 and the transverse blind holes 238 of copper plate 232.

At the same time aluminum plate 230 will yield to the conducting pins 234 of the copper plate and let the conducting pin 230 be inserted to the aluminum plate 230.

The combination of high isostatic pressure and high temperature causes the faying surfaces of the plate 232 and 230 to be bonded after a period of about 2 hours. The exact values of the temperature, time, and pressure variables are determined by experiments and modeling of the plate materials. After bonding process ends, the heater can be deactivated and the chamber can be vented to the atmosphere. When the plate weldments cool they may be removed from the chamber.

Figure 11:
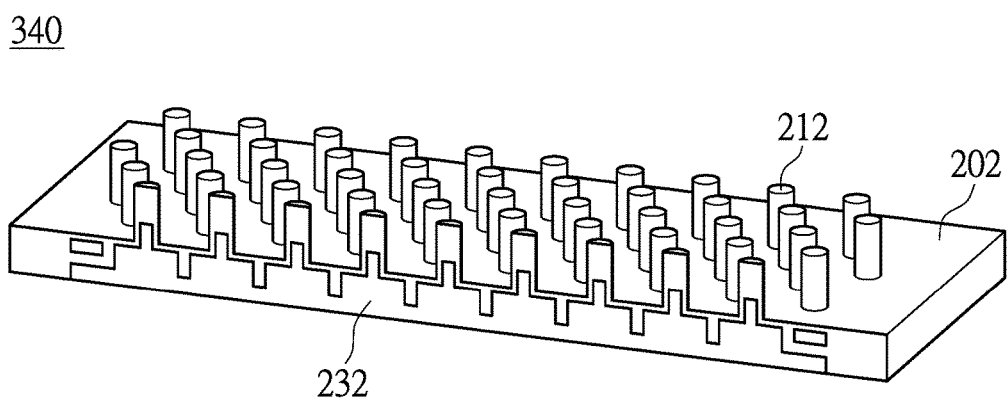
FIG. 11 shows a cross-sectional view of a finished heat sink according to another example embodiment.

FIG. 11 shows a cross-sectional view of a finished heat sink 340 according to an example embodiment of the present invention. After cooling, the weldment, i.e. the bonded aluminum/copper plate structure, may be processed to form a plurality of aluminum convection pins 212 on the exposed surface of aluminum plate 230. The plurality of aluminum convection pins 212 may be formed directly above the copper conducting pins 234, respectively, and each contains a portion of a corresponding copper conducting pin, respectively. Because of the aluminum protrusions formed in the blind holes 236 and 238 of the copper plate 232 and the copper conducting pins 234 inserted into the aluminum pate 230, the finished heat sink 340 exhibits greater resistance to shear, tensile, and thermal expansion forces, meanwhile having a low thermal resistance.

What is claimed is:

1. A heat transfer device, comprising:
a bonded dissimilar material structure including:
   a first component made of a first dissimilar material;
   a second component made of a second dissimilar material stacked under the first component; and
   a plurality of blind holes formed on an upper surface of the second component,
      wherein the first component has a plurality of protrusions formed in the plurality of blind holes on the second component, respectively, and
      wherein the second component includes a plurality of protrusions inserted into the first component; and
a plurality of convection pins each including the first dissimilar material and each disposed protruding from an upper surface of the bonded dissimilar material structure.

2. The bonded dissimilar material structure according to claim 1, wherein the plurality of blind holes are approximately round-shaped cavities.

3. The bonded dissimilar material structure according to claim 1, wherein the plurality of blind holes are column-shaped blind holes.

4. The bonded dissimilar material structure according to claim 1, wherein the first dissimilar material is aluminum or aluminum alloys.

5. The bonded dissimilar material structure according to claim 1, wherein the second dissimilar material is copper or copper alloys.

6. The bonded dissimilar material structure according to claim 1, wherein the first dissimilar material and the second dissimilar material are bonded using a diffusion bonding process.

7. The bonded dissimilar material structure according to claim 1, wherein the second dissimilar material has a yield strength higher than the yield strength of the first dissimilar material.

8. The heat transfer device of claim 1, wherein each convection pin of the plurality of convection pins is positioned over a corresponding protrusion of the plurality of protrusions.

9. A heat transfer device, comprising:
a bonded dissimilar material structure including:
   a first component made of a first dissimilar material having an accommodating space;
   a second component made of a second dissimilar material stacked under the first component; and
   a plurality of blind holes formed on an upper surface and side surfaces of the second component,
      wherein the accommodating space accommodates the second component, covering the upper surface and side surfaces of the second component,
      wherein the first component has a plurality of protrusions formed in the plurality of blind holes on the second component, respectively, and
      wherein the second component includes a plurality of protrusions inserted into the first component; and
a plurality of convection pins each including the first dissimilar material and each disposed protruding from an upper surface of the bonded dissimilar material structure.

10. The bonded dissimilar material structure according to claim 9, wherein the plurality of blind holes are column-shaped blind holes.

11. The bonded dissimilar material structure according to claim 9, wherein the first dissimilar material is aluminum or aluminum alloys.

12. The bonded dissimilar material structure according to claim 9, wherein the second dissimilar material is copper or copper alloys.

13. The bonded dissimilar material structure according to claim 9, wherein the upper surface and side surfaces of the second component are transverse to each other, and
wherein at least one blind hole on the upper surface and at least one blind hole on a side surface intersect each other.

14. The heat transfer device of claim 9, wherein each convection pin of the plurality of convection pins is positioned over a corresponding protrusion of the plurality of protrusions.

* * * * *